(12) United States Patent
Nagorny

(10) Patent No.: US 12,512,304 B2
(45) Date of Patent: Dec. 30, 2025

(54) PLASMA SOURCE FOR SEMICONDUCTOR PROCESSING

(71) Applicant: Applied Materials, Inc., Santa Clara, CA (US)

(72) Inventor: Vladimir Nagorny, Tracy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/937,106

(22) Filed: Jul. 23, 2020

(65) Prior Publication Data
US 2022/0028663 A1    Jan. 27, 2022

(51) Int. Cl.
*H01L 21/00*    (2006.01)
*H01J 37/32*    (2006.01)
(Continued)

(52) U.S. Cl.
CPC .. *H01J 37/32541* (2013.01); *H01J 37/32348* (2013.01); *H01J 37/32568* (2013.01); *H01L 21/3065* (2013.01); *H01L 21/67069* (2013.01); *H01J 2237/038* (2013.01); *H01J 2237/0453* (2013.01); *H01J 2237/334* (2013.01)

(58) Field of Classification Search
CPC ................................................ H01J 37/32348
See application file for complete search history.

(56) References Cited

U.S. PATENT DOCUMENTS

| 4,924,218 | A | * | 5/1990 | Weber | .................. G09G 3/2927 345/67 |
| 6,764,658 | B2 | * | 7/2004 | Denes | ..................... B29C 59/14 118/723 E |

(Continued)

FOREIGN PATENT DOCUMENTS

| CN | 109698110 A | 4/2019 |
| JP | 2000-515304 A | 11/2000 |

(Continued)

OTHER PUBLICATIONS

International Search Report and Written Opinion mailed Nov. 11, 2021 in International Patent Application No. PCT/US2021/041917, 7 pages.

(Continued)

*Primary Examiner* — Parviz Hassanzadeh
*Assistant Examiner* — Michelle Crowell
(74) *Attorney, Agent, or Firm* — Kilpatrick Townsend & Stockton LLP

(57) ABSTRACT

The present technology encompasses plasma sources including a first plate defining a first plurality of apertures arranged in a first set of rows. The first plate may include a first set of electrodes extending along a separate row of the first set of rows. The plasma sources may include a second plate defining a second plurality of apertures arranged in a second set of rows. The second plate may include a second set of electrodes extending along a separate row of the second set of rows. Each aperture of the second plurality of apertures may be axially aligned with an aperture of the first plurality of apertures. The plasma sources may include a third plate positioned between the first plate and the second plate. The third plate may define a third plurality of apertures.

17 Claims, 6 Drawing Sheets

(51) Int. Cl.
*H01L 21/3065* (2006.01)
*H01L 21/67* (2006.01)

(56) References Cited

U.S. PATENT DOCUMENTS

| | | |
|---|---|---|
| 2003/0129107 A1 | 7/2003 | Denes et al. |
| 2006/0042545 A1* | 3/2006 | Shibata ............. H01J 37/32009 |
| | | 118/722 |
| 2006/0054279 A1 | 3/2006 | Kim et al. |
| 2007/0037408 A1* | 2/2007 | Tachibana ............. C23C 16/515 |
| | | 438/778 |
| 2009/0015160 A1* | 1/2009 | Rueger ................ H05H 1/2406 |
| | | 313/582 |
| 2009/0295288 A1* | 12/2009 | Eden .................... H05H 1/2406 |
| | | 313/582 |
| 2012/0000609 A1* | 1/2012 | Do .................... H01J 37/32568 |
| | | 156/345.48 |
| 2012/0258555 A1* | 10/2012 | Holland ............ H01J 37/32596 |
| | | 438/5 |
| 2014/0217882 A1* | 8/2014 | Yagi ....................... B01J 19/088 |
| | | 313/268 |
| 2015/0137677 A1* | 5/2015 | Sohn ........................ A61L 2/14 |
| | | 313/268 |
| 2015/0303037 A1* | 10/2015 | Ha .................... C23C 16/45574 |
| | | 118/723 R |
| 2016/0053376 A1* | 2/2016 | Nam ................... H01J 37/3244 |
| | | 216/71 |
| 2018/0002199 A1* | 1/2018 | Yokoyama ................ C02F 1/50 |
| 2018/0002203 A1* | 1/2018 | Yokoyama ........... H05H 1/2406 |
| 2018/0211817 A1 | 7/2018 | Simor et al. |
| 2019/0122860 A1 | 4/2019 | Lee et al. |
| 2019/0122866 A1* | 4/2019 | Nam ................... H01L 21/3065 |
| 2019/0122867 A1* | 4/2019 | Nam ....................... H01J 1/025 |
| 2020/0027688 A1* | 1/2020 | Kubota ................... H01J 37/06 |

FOREIGN PATENT DOCUMENTS

| | | |
|---|---|---|
| JP | 2013038148 A | 2/2013 |
| KR | 10-1926984 B1 | 12/2018 |
| TW | 201737297 A | 10/2017 |
| TW | 201824334 A | 7/2018 |

OTHER PUBLICATIONS

Application No. PCT/US2021/041917 , International Preliminary Report on Patentability, Mailed On Feb. 2, 2023, 6 pages.
U.S. Appl. No. 18/174,516, filed Feb. 24, 2023, Final Office Action mailed Jun. 4, 2024, 17 pages.
U.S. Appl. No. 18/174,516, filed Feb. 24, 2023, Non-Final Office Action mailed Oct. 6, 2023, 13 pages.
European Search Report for EP 21845574 dated Jul. 19, 2024, 11 pages.
Notice of Reasons for Rejection for JP 2023-504261 dated Jul. 9, 2024, 10 pages.
Notice of Reasons for Rejection for JP 2023-504261 dated Mar. 5, 2024, 11 pages.
Notice of Decision to Grant for TW 110126568 dated Oct. 3, 2023, 4 pages.
Office Action for TW 113100176 dated May 31, 2024, 6 pages.
Office Action for TW 110126568 dated Apr. 27, 2022, 6 pages.
CN202180050336.7, "Office Action", Mar. 20, 2025, 10 pages.
KR10-2023-7006188, "Office Action", Apr. 21, 2025, 9 pages.

* cited by examiner

PLASMA SOURCE FOR SEMICONDUCTOR PROCESSING

TECHNICAL FIELD

The present technology relates to semiconductor systems, processes, and equipment. More specifically, the present technology relates to plasma sources incorporated in semiconductor processing chambers and utilized in semiconductor processing.

BACKGROUND

Many substrate processing systems use a plasma generation source during semiconductor substrate processing. Plasma sources are utilized in processing to develop radical effluents that may facilitate deposition, etching, and cleaning, among other operations in semiconductor processing. Plasma sources are often confined within a particular operational regime, which may be limited by power, chamber pressure, or any number of other aspects of semiconductor processing. Although different sources operating on various principles, including microwave excitation and capacitive or inductive coupling, may provide a number of different performance benefits, each of these systems may be limited in one or more ways. As semiconductor processing includes more complicated operations requiring more precise uniformity, many conventional plasma sources may be incapable of producing desirable outcomes.

Thus, there is a need for improved systems, components, and methods that can be used to improve semiconductor processing outcomes and uniformity. These and other needs are addressed by the present technology.

SUMMARY

The present technology encompasses plasma sources including a first plate defining a first plurality of apertures arranged in a first set of rows. The first plate may include a first set of electrodes. Each electrode of the first set of electrodes may extend along a separate row of the first set of rows. The plasma sources may include a second plate defining a second plurality of apertures arranged in a second set of rows. The second plate may include a second set of electrodes. Each electrode of the second set of electrodes may extend along a separate row of the second set of rows. Each aperture of the second plurality of apertures may be axially aligned with an aperture of the first plurality of apertures. The plasma sources may include a third plate positioned between the first plate and the second plate. The third plate may define a third plurality of apertures. Each aperture of the third plurality of apertures may be axially aligned with an aperture of the first plurality of apertures and an aperture of the second plurality of apertures.

In some embodiments, each axially aligned aperture of the first plurality of apertures, aperture of the second plurality of apertures, and aperture of the third plurality of apertures may form a plasma cell extending through the plasma source. The sources may include a first power supply electrically coupled with each electrode of the first set of electrodes. The first power supply may be configured to deliver a first voltage along each electrode of the first set of electrodes. The sources may include a second power supply electrically coupled with each electrode of the second set of electrodes. The second power supply may be configured to deliver a second voltage along each electrode of the second set of electrodes. The first power supply and the second power supply may be configured to produce an electrical discharge within a plasma cell positioned at an overlapping electrode of the first set of electrodes and an electrode of the second set of electrodes each receiving power. Each aperture of the first plurality of apertures may be characterized by a first diameter, and each aperture of the third plurality of apertures may be characterized by a second diameter different from the first diameter. Each electrode of the first set of electrodes may be maintained electrically isolated from each other electrode of the first set of electrodes along a surface of the first plate. Each electrode of the first set of electrodes may extend along a first surface of the first plate. Each electrode of the first set of electrodes may further extend along sidewalls of each aperture of the first plurality of apertures intersected by an associated electrode. The sources may include a layer of dielectric material overlying electrode material extending along sidewalls of each aperture of the first plurality of apertures.

Some embodiments of the present technology may encompass semiconductor processing chambers. The chambers may include a substrate support configured to support a substrate for processing, and at least partially defining a processing region from below. The chambers may include a plasma source positioned within the semiconductor processing chamber. The plasma source may include a first plate defining a first aperture. The plasma source may include a first electrode extending across a surface of the first plate and intersecting the first aperture. The plasma source may include a second plate defining a second aperture, and the second aperture may be coaxial with the first aperture. The plasma source may include a second electrode extending across a surface of the second plate and intersecting the second aperture. The second electrode may extend perpendicular to the first electrode. The plasma source may include a third plate positioned between the first plate and the second plate. The third plate may define a third aperture coaxial with the first aperture and the second aperture to form a channel through the plasma source.

In some embodiments, the first electrode may extend about a sidewall of the first aperture, and the second electrode may extend about a sidewall of the second aperture. The chambers may include a first power supply configured to deliver a first voltage along the first electrode. The chambers may include a second power supply configured to deliver a second voltage along the second electrode. The chambers may include a first dielectric material overlying a portion of the first electrode extending about the sidewall of the first aperture. The chambers may include a second dielectric material overlying a portion of the second electrode extending about the sidewall of the second aperture. The first aperture may be characterized by a first diameter, and the third aperture may be characterized by a second diameter different from the first diameter. The plasma source may at least partially define the processing region from above. The first aperture may be an aperture of a first plurality of apertures. The first electrode may be an electrode of a first plurality of electrodes. Each aperture of the first plurality of apertures may be intersected by an electrode of the first plurality of electrodes.

Some embodiments of the present technology may encompass methods of semiconductor processing. The methods may include delivering a precursor to a semiconductor processing chamber. The semiconductor processing chamber may have a plasma source including a first plate defining a first aperture. The plasma source may include a first electrode extending across a surface of the first plate and intersecting the first aperture. The plasma source may include a second plate defining a second aperture. The second aperture may be coaxial with the first aperture. The plasma source may include a second electrode extending across a surface of the second plate and intersecting the second aperture. The second electrode may extend perpendicular to the first electrode. The plasma source may include a third plate positioned between the first plate and the second plate. The third plate may define a third aperture coaxial with the first aperture and the second aperture to form a channel through the plasma source. The plasma source may include a first power supply configured to deliver a first voltage along the first electrode. The plasma source may include a second power supply configured to deliver a second voltage along the second electrode. The methods may include providing the first voltage along the first electrode. The methods may include forming a plasma of the precursor within the channel through the plasma source.

In some embodiments, the methods may include, prior to delivering the precursor providing the first voltage along the first electrode. The methods may include providing the second voltage along the second electrode to produce a memory charge at the channel through the plasma source. The first electrode may extend about a sidewall of the first aperture. The second electrode may extend about a sidewall of the second aperture. The plasma source may also include a first dielectric material overlying a portion of the first electrode extending about the sidewall of the first aperture. The plasma source may also include a second dielectric material overlying a portion of the second electrode extending about the sidewall of the second aperture. A breakdown voltage within the channel formed through the plasma source may be less than or about 500 V.

Such technology may provide numerous benefits over conventional systems and techniques. For example, plasma sources according to embodiments of the present technology may operate over a broader pressure regime than conventional sources. Additionally, the sources may be operated to improve in situ uniformity of operations performed on a semiconductor substrate. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
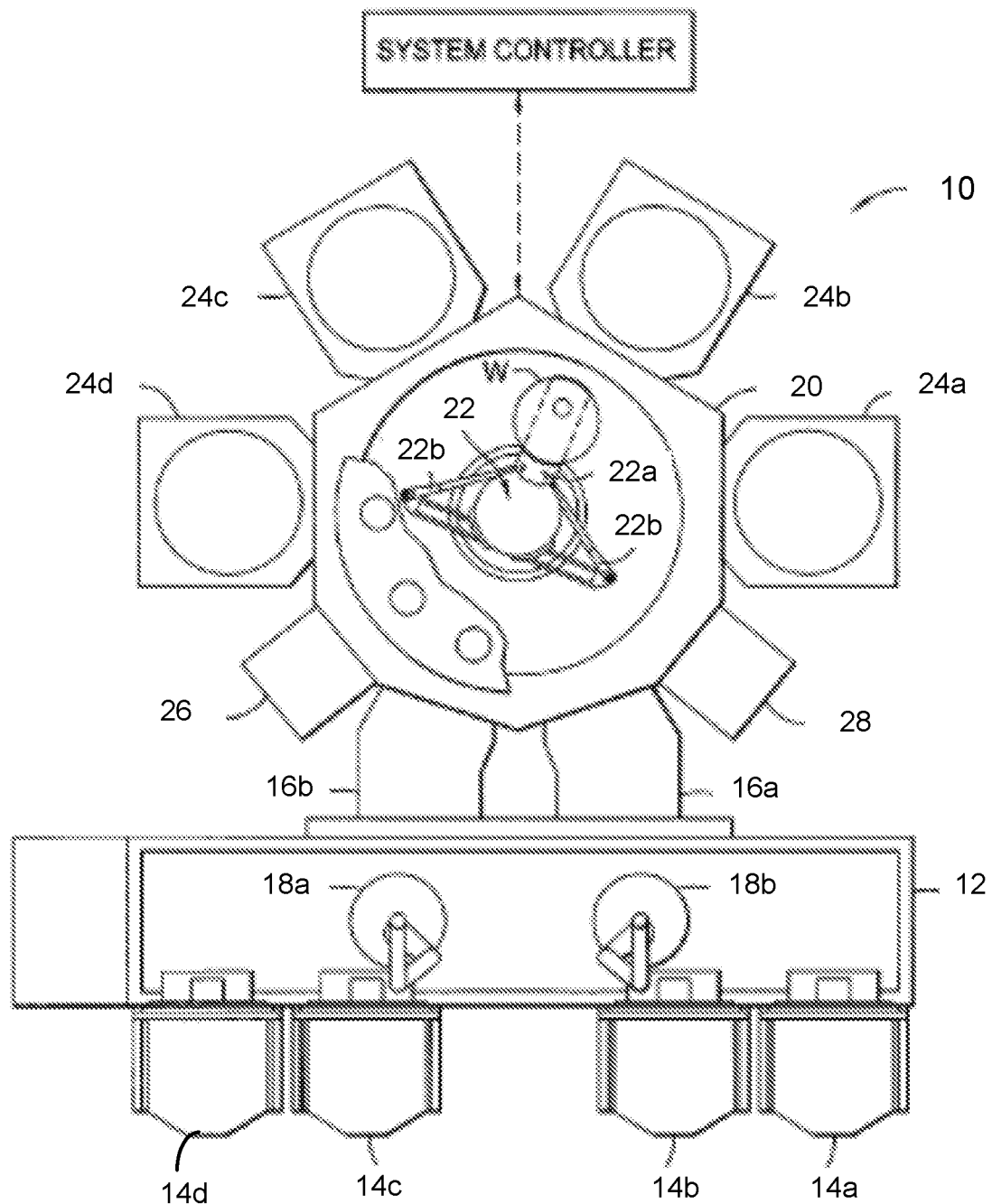
FIG. 1 shows a schematic top view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma used in semiconductor processing is often limited to a particular pressure range, which typically extends from a few mTorr unto a few Torr, such as below 20 Torr. As device architecture becomes more intricate, higher pressure plasma may enable improved operational capabilities. However, conventional sources are limited to discrete ranges of pressure, and often cannot extend source generation to higher pressures. Additionally, when pressure is increased, process uniformity may be challenged. This may be due to the fact that many conventional plasma sources include one or two antennas, which may not be capable to distribute species uniformly over a substrate at higher pressure where diffusion may be slowed. While some conventional plasma sources operating at relatively low pressure, such as a few Ton, may utilize a grid to neutralize ions, this device as an attempt to improve plasma uniformity is limited to minimal non-uniformity of plasma products above the grid.

The present technology encompasses plasma sources compatible with a variety of chamber architectures, and which may be capable of sustaining plasma from below 1 Torr up to 50 Torr or greater with a configuration that can be scaled to virtually any substrate size. The plasma sources may include hundreds or thousands of individual plasma sources assembled in a plane so that incoming process precursors may pass through the individual cells where the precursors may be energized at each location. The sources may be driven from one or more RF generators for a capacitive coupled plasma discharge version as well as from a low frequency, square wave AC generator for a dielectric barrier discharge version. This may afford control of discharge in every individual cell using addressing for controlling the average power applied to each cell.

The present technology overcomes many conventional issues by utilizing a plasma source operating on dielectric barrier discharge formed in one or more cells formed through the plasma source. By controlling electrode distances along the plasma source, voltage may be reduced compared to a number of conventional plasma sources, which may extend the pressure operating window of exemplary sources. Additionally, by producing a number of independently operated plasma cells through the source, on-wafer characteristics may be adjusted in situ, and in a feed-forward processes where results of a processing operation may be utilized to modify plasma generation through the source, without requiring adjustments to the plasma source itself. For example, while many conventional plasma sources may adjust aperture diameters to increase or decrease effects at the substrate level for a specific semiconductor process, the present technology can modify plasma pulsing through any number of plasma cells to modify any variety of processes being performed.

The rate of energy transfer to electrons and plasma generation rate may depend on reduced electric field in the gas, which may be inversely related to gas pressure. Accordingly, overall balance conditions, including voltage, may depend on the product of pressure and plasma characteristic size. However, at smaller and larger pressures, plasma may be more difficult to sustain, and may therefore require increased voltages. Hence, to operate plasma at high pressure, the present technology may significantly reduce the size of the source by utilizing a number of small, interconnected sources instead of one. Advantageously, these individual sources may be individually controlled. Replacement of one larger source with a larger number of small sources may also simplify the chamber architecture and reduce the number of possible controlling elements used to achieve higher process uniformity.

The concept of a basic element or mini-source of the present technology may be based on a simple cylindrical design that may be used for both RF capacitively-coupled plasma operation and dielectric barrier discharge operation as will be described further below. The arrangement of the individual cells may enable plasma contamination to be avoided with the electrode material. When power is applied to the electrodes of the source, discharge conditions may be satisfied inside the channel, which may allow plasma generation, while limiting or preventing plasma generation externally to the individual channels formed.

The individual sources may be arranged in a grid-like configuration with all top electrodes connected together and all bottom electrodes connected together with a spacer filling a space between top and bottom electrodes so precursors may only flow through the individual cells and discharge can be controlled to occur inside the cells. The sources may be made in any number of ways. For example, in some embodiments the individual electrodes of either the top or bottom electrode may be made of a single plate of conductive material with holes for the channels, and the spacer between them defining the gap size, along with protective plates on a top and bottom side of the source as will be described below. A surface of each hole may be coated with dielectric, which may be deposited, inserted as a tube, to limit discharge outside of the channels. Cooling may also be applied in any number of ways, such as, for example, by adjusting thickness and coupling of the electrode plates with cooled portions of the chamber body.

The electrodes may be included as plates or deposited as films in a number of ways, which may provide a number of connection benefits. For example, depositing conductive films on a dielectric plate to produce electrodes for cells inside the holes and connecting them may provide an opportunity to connected the cell electrodes in lines, such as scan electrodes, and the second electrodes, such as bulk electrodes, may be connected all together. This may allow all bulk electrodes to be connected to one terminal of the power supply and scan electrodes to the other terminal of the power supply through a control board, which may allow all scan lines to be connected simultaneously affording uniform plasma generation or allowing only some lines to generate discharge. Additionally, the both top and bottom electrodes may be formed in lines extending perpendicular to one another, which may allow plasma generation not only along individual lines, but also in individual cells with addressing of any selection of cells across the source when applying power to all cells together. In one non-limiting example, each cell may include three electrodes, including a bulk, scan, and addressing electrode next to the scan electrode, along with additional dielectric layers separating the electrodes. The bulk electrodes may all be connected together while the scan and addressing electrodes may run perpendicular to one another. As will be explained below, the addressing electrode may be used for addressing alone, while the bulk and scan electrodes may be used for both sustaining and resetting each cell prior to addressing.

The cells may all be operated independently of each other cell, and minor penetration of particles between cells may not impact discharge conditions within the cell. Communication between the cells may be limited to the applied voltage. In operation, the electrodes may be connected to produce a capacitively-coupled source or a dielectric barrier discharge. As a capacitively-coupled plasma source, the top and bottom electrodes can be driven by a single RF generator and match when all top electrodes are connected together and all bottom electrodes are connected together. Additionally, electrodes in the scan lines, for example, may be connected to a common RF source or match through controlled switches. Since the power deposited in each cell may be the same, and thus the power required to drive a fraction of the source may be proportional to that fraction, the switch controller may have a feedback to the RF power generator that may automatically decrease the power when some lines are disconnected. The power in any cell may be controlled by the RF generator output voltage.

For dielectric barrier discharge, a single polarity high voltage may be applied to the gap at each cell for a period of time during which discharge ignites, develops, and extinguishes, leaving a "memory" charge on the dielectric walls of the cell, which compensates the electric field from voltages applied to electrodes. The next pulse within each cell occurs when the voltage to the cell, like a pixel, is reversed. Memory charge may allow plasma to be generated. When the driving voltage is reversed, a combination of the driving and memory charge induced voltages may double that of the driving voltage itself. Hence, by using the magnitude of the driving voltage to be lower than the cell breakdown voltage, while the net voltage across any cell with memory charge is significantly higher than the breakdown voltage, may allow driving the source with some cells generating plasma, while others without a memory charge fail to ignite. The source may be driven with a square waveform from a single voltage DC power supply and controlled switches, which may connect alternatively each electrode to ground or a voltage terminal. For sources with two bulk electrodes or with one bulk and one set of scan line electrodes, which may not include addressing, a relatively simple driving scheme may be utilized. For example, a line of switches may be connected to the power supply at one terminal and with all or a select number of lines. The bulk electrode may be connected to the other terminal of the power supply. The power supply may be operated with a few levels of sustain voltages, and placing an initial memory charge can be applied to all cells initially before applying a higher voltage for a sustain operation, where a single pulse of voltage from a higher level of sustain voltage may be applied, or another voltage above the initial voltage may be applied specifically to address cells. Additionally, a gas pressure or change in gas may be used to initiate a single pulse, and the memory charge may not change when the pressure or gas are changed.

Dielectric barrier discharge may be a pulsing discharge where it extinguishes every half cycle, which allows different power control form a capacitively coupled plasma. In each discharge pulse, energy deposited in the cell may be proportional to the square of voltage times the capacitance of the cell electrodes, and thus if the amplitude of the voltage applied stays constant, the energy in every pulse may be the same. Control of the power in each cell may then be controlled by a pulse frequency, and total energy generated in any cell during the process may be controlled by the total number of pulses. Since the power supply may operate at a fixed voltage, there may not be a need for a feedback between the switches and the power supply like in a capacitively coupled plasma version.

Although the remaining disclosure will routinely identify specific etching processes utilizing the disclosed technology, it will be readily understood that the systems and methods are equally applicable to a variety of other processes as may occur in the described chambers. For example, plasma sources encompassed by the present technology may be applicable to deposition, etching, and cleaning chambers operating at a variety of conditions and performing any number of plasma processes. Accordingly, the technology should not be considered to be so limited as for use with the described processes alone. The disclosure will discuss one possible system and chamber in which the present technology may be incorporated before describing sources and methods or operations of exemplary process sequences according to some embodiments of the present technology. It is to be understood that the technology is not limited to the equipment described, and processes discussed may be performed in any number of processing chambers and systems.

FIG. 1 shows a top plan view of one embodiment of a processing system 10 of deposition, etching, baking, and/or curing chambers according to embodiments. The tool or processing system 10 depicted in FIG. 1 may contain a plurality of process chambers, 24*a-d*, a transfer chamber 20, a service chamber 26, an integrated metrology chamber 28, and a pair of load lock chambers 16*a-b*. The process chambers may include any number of structures or components, as well as any number or combination of processing chambers. For example, any one or more processing chambers performing any number of etching, deposition, or other processes may incorporate one or more aspects of plasma sources discussed throughout this disclosure.

To transport substrates among the chambers, the transfer chamber 20 may contain a robotic transport mechanism 22. The transport mechanism 22 may have a pair of substrate transport blades 22*a* attached to the distal ends of extendible arms 22*b*, respectively. The blades 22*a* may be used for carrying individual substrates to and from the process chambers. In operation, one of the substrate transport blades such as blade 22*a* of the transport mechanism 22 may retrieve a substrate W from one of the load lock chambers such as chambers 16*a-b* and carry substrate W to a first stage of processing, for example, a treatment process as described below in chambers 24*a-d*. The chambers may be included to perform individual or combined operations of the described technology. For example, while one or more chambers may be configured to perform a deposition or etching operation, one or more other chambers may be configured to perform a pre-treatment operation and/or one or more post-treatment operations described. Any number of configurations are encompassed by the present technology, which may also perform any number of additional fabrication operations typically performed in semiconductor processing.

If the chamber is occupied, the robot may wait until the processing is complete and then remove the processed substrate from the chamber with one blade 22*a* and may insert a new substrate with a second blade. Once the substrate is processed, it may then be moved to a second stage of processing. For each move, the transport mechanism 22 generally may have one blade carrying a substrate and one blade empty to execute a substrate exchange. The transport mechanism 22 may wait at each chamber until an exchange can be accomplished.

Once processing is complete within the process chambers, the transport mechanism 22 may move the substrate W from the last process chamber and transport the substrate W to a cassette within the load lock chambers 16*a-b*. From the load lock chambers 16*a-b*, the substrate may move into a factory interface 12. The factory interface 12 generally may operate to transfer substrates between pod loaders 14*a-d* in an atmospheric pressure clean environment and the load lock chambers 16*a-b*. The clean environment in factory interface 12 may be generally provided through air filtration processes, such as HEPA filtration, for example. Factory interface 12 may also include a substrate orienter/aligner that may be used to properly align the substrates prior to processing. At least one substrate robot, such as robots 18*a-b*, may be positioned in factory interface 12 to transport substrates between various positions/locations within factory interface 12 and to other locations in communication therewith. Robots 18*a-b* may be configured to travel along a track system within factory interface 12 from a first end to a second end of the factory interface 12.

The processing system 10 may further include an integrated metrology chamber 28 to provide control signals, which may provide adaptive control over any of the processes being performed in the processing chambers. The integrated metrology chamber 28 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Each of processing chambers 24*a-d* may be configured to perform one or more process steps in the fabrication of a semiconductor structure, and any number of processing chambers and combinations of processing chambers may be used on multi-chamber processing system 10. For example, any of the processing chambers may be configured to perform a number of substrate processing operations including any number of deposition processes including cyclical layer deposition, atomic layer deposition, chemical vapor deposition, physical vapor deposition, as well as other operations including etch, pre-clean, pre-treatment, post-treatment, anneal, plasma processing, degas, orientation, and other substrate processes. Some specific processes that may be performed in any of the chambers or in any combination of chambers may be metal deposition, surface cleaning and preparation, thermal annealing such as rapid thermal processing, and plasma processing. Any other processes may similarly be performed in specific chambers incorporated into multi-chamber processing system 10, including any process described below, as would be readily appreciated by the skilled artisan.

Figure 2:
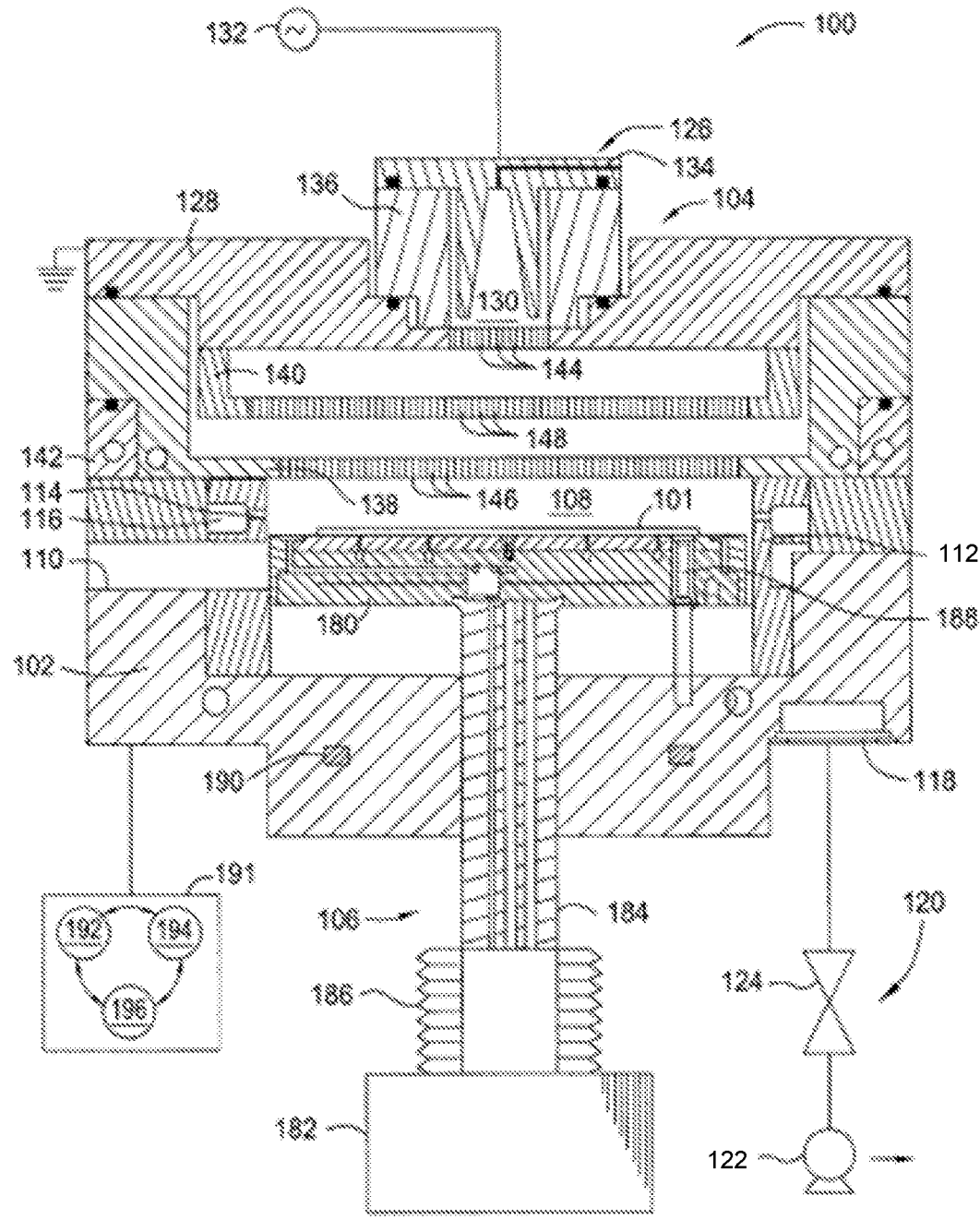
FIG. 2 shows a schematic cross-sectional view of an exemplary processing system according to some embodiments of the present technology.

FIG. 2 illustrates a schematic cross-sectional view of an exemplary processing chamber 100 according to some embodiments of the present technology. Plasma sources according to embodiments of the present technology may be incorporated in chambers such as chamber 100, as well as any processing chamber, which may include one or more components as described with chamber 100. Chamber 100 may illustrate a semiconductor processing chamber and accessories, which may be one of many chambers that can be incorporated on system 10 described above. The processing chamber 100 may be used for various plasma processes. In some embodiments, the processing chamber 100 may be used to perform dry etching with one or more etching agents. For example, the processing chamber may be used for ignition of plasma from a precursor including oxygen-containing precursors, hydrogen-containing precursors, carbon-containing precursors, nitrogen-containing precursors, halogen-containing precursors, or any number of other precursors, which may be enhanced and used to remove material from a substrate 101.

The processing chamber 100 may include a chamber body 102, a lid assembly 104, and a support assembly 106. The lid assembly 104 may be positioned at an upper end of the chamber body 102. The support assembly 106 may be housed or at least partially contained within a processing region of the chamber or an interior volume 108, at least partially defined by the chamber body 102, and which may constitute a processing region of the chamber 100. The chamber body 102 may include a slit valve opening 110 formed or defined in a sidewall thereof. The slit valve opening 110 may be selectively opened and closed to allow access to the processing region or interior volume 108 by a substrate handling robot.

The chamber body 102 may further include a liner 112 that may surround the support assembly 106. The liner 112 may be removable for servicing and cleaning. The liner 112 may be made of a metal such as aluminum, a ceramic material, or any other process compatible material. In some embodiments, the liner 112 may include one or more apertures 114 and a pumping channel 116 formed therein, and which may be in fluid communication with a vacuum port 118. The apertures 114 may provide a flow path for gases into the pumping channel 116. The pumping channel 116 may provide an egress for the gases within the chamber 100 to vacuum port 118. A vacuum system 120 may be coupled with the vacuum port 118. The vacuum system 120 may include a vacuum pump 122 and a throttle valve 124. The throttle valve 124 may regulate the flow of gases through the chamber 100. The vacuum pump 122 may be coupled to the vacuum port 118 disposed in the interior volume 108.

The lid assembly 104 may include at least two stacked components configured to form a plasma volume or cavity there between. In some embodiments, the lid assembly 104 may include a first electrode 126 or upper electrode disposed vertically above a second electrode 128 or lower electrode. The first electrode 126 and the second electrode 128 may confine a plasma cavity 130, there between. The first electrode 126 may be coupled with a power source 132, such as an RF power supply. The second electrode 128 may be connected to ground, forming a capacitively coupled region between the two electrodes. The first electrode 126 may define or be in fluid communication with a gas inlet 134. One or more gas inlets may be included, and may deliver one or more precursors into the plasma cavity 130.

The lid assembly 104 may also include an isolator ring 136 that may electrically isolate the first electrode 126 from the second electrode 128. The isolator ring 136 may be made from aluminum oxide or any other insulative, processing compatible material. The lid assembly may also include a gas distribution plate 138 and a blocker plate 140. The second electrode 128, the gas distribution plate 138, and the blocker plate 140 may be stacked and disposed on a lid rim 142, which may be coupled with the chamber body 102.

In some embodiments, the second electrode 128 may include or define a plurality of gas passages or apertures 144 providing egress from the plasma cavity 130 to allow effluents from the plasma cavity 130 to flow towards the processing region. The gas distribution plate 138 may include or define a plurality of apertures 146 configured to distribute the flow of gases or plasma effluents into the processing region 108 and into contact with a substrate 101 housed therein. The gas distribution plate 138 may also be a plasma source as will be described further below, which may be used in lieu of or in addition to the remote plasma source seated on the chamber as illustrated. The blocker plate 140 may optionally be disposed between the second electrode 128 and the gas distribution plate 138. The blocker plate 140 may include or define a plurality of apertures 148 to provide a plurality of gas passages from the second electrode 128 to the gas distribution plate 138, and which may provide an amount of lateral or radial distribution of the effluents or gases.

The support assembly 106 may include a support member 180. The support member 180 may be configured to support the substrate 101 for processing. The support member 180 may be coupled with a lift mechanism 182 through a shaft 184, which may extend through a bottom surface of the chamber body 102. The lift mechanism 182 may be flexibly sealed to the chamber body 102 by a bellows 186 that may prevent vacuum leakage from around the shaft 184. The lift mechanism 182 may allow the support member 180 to be moved vertically within the chamber body 102 between a lower transfer position and a number of raised process positions. Additionally, one or more lift pins 188 may be disposed through the support member 180. The one or more lift pins 188 may be configured to extend through the support member 180 such that the substrate 101 may be raised off the surface of the support member 180. The one or more lift pins 188 may be activated by a lift ring 190.

To operate a variety of aspects of the processing chamber, a controller 191 may be included in some embodiments. Controller 191 may variously include a central processing unit 192 and memory 194, which may be of any kind, and which may be operated by or with any accessory devices 196, as may be included in any system described. The memory 194 may include any number of specific instructions for performing one or more aspects of any method or operation described, or which may be performed in chamber 100, or any other system.

Figure 3:
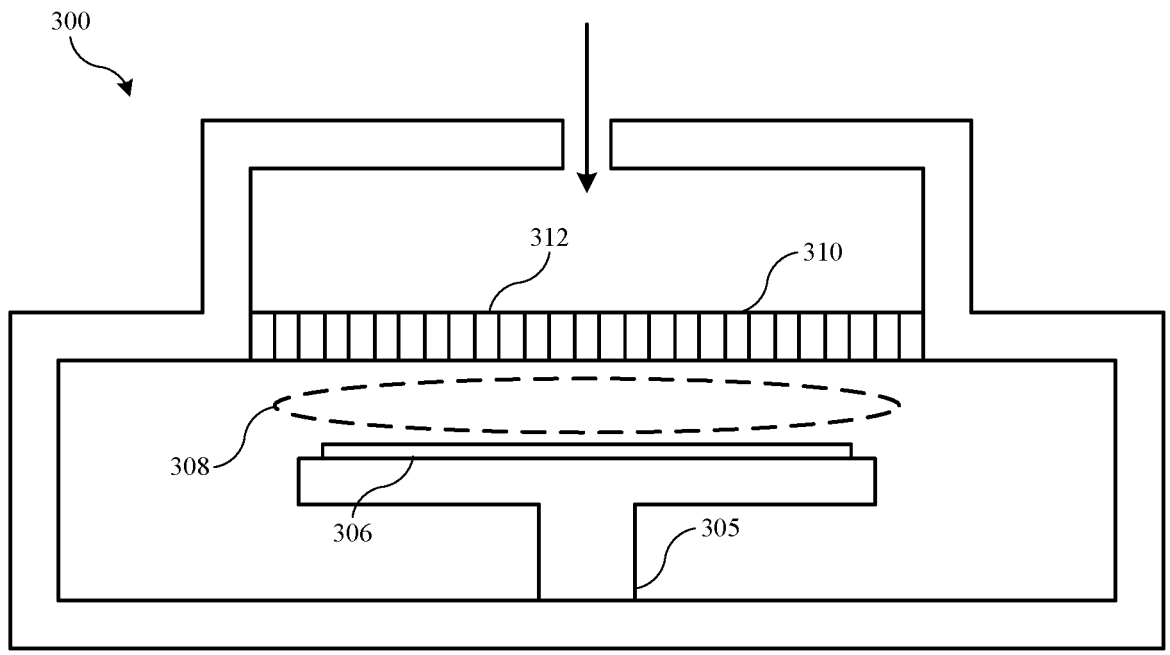
FIG. 3 shows a schematic partial cross-sectional view of an exemplary processing chamber according to some embodiments of the present technology.

FIG. 3 shows a schematic partial cross-sectional view of an exemplary processing chamber 300 according to some embodiments of the present technology. Processing chamber 300 may illustrate a limited configuration including a plasma source for performing etching, deposition, cleaning, or other semiconductor processing operations. The figure may show certain features of processing chambers that can be included in any processing chamber, such as gas distribution plate 138 as described above. Processing chamber 300 may include any aspect of system 100 described previously, and may illustrate additional details of the system as described above, including a plasma source incorporated within a chamber. It is to be understood that the figure is not intended to limit the present technology in any way, and plasma sources described below may be included in any type of semiconductor or other processing system in which plasma generation may be beneficial. Additionally, because of the highly configurable nature of plasma sources according to some embodiments of the present technology, chamber architecture may be greatly simplified over conventional designs, as the source may be incorporated in virtually any chamber configuration, including basic chamber architectures as illustrated.

Processing chamber 300 may include general aspects of a processing chamber incorporating a plasma source configured to operate by dielectric barrier discharge to produce plasma effluents of precursors delivered into the processing chamber. Although any number of additional components may be incorporated within the processing chamber, including blocker plates, distributers, heating or cooling components, remote plasma sources, pumping systems, controllers, or any number of other features of semiconductor processing chambers. Exemplary processing chambers may include a substrate support 305 and a plasma source 310. Substrate support 305 may be configured to support a substrate 306 for processing within a substrate processing region 308. As illustrated, substrate support 305 may at least partially define the substrate processing region from below. Substrate support 305 may include any additional features including translation and rotation capabilities as previously described, as well as a number of incorporated components including heating or cooling features, and electrodes, such as biasing electrodes, for example. Substrate support 305 may include any feature of support assembly 106 described above, as well as features of any other substrate support that may facilitate chucking and/or processing of a substrate 306.

Processing chamber 300 may also include a plasma source 310, which may be positioned within the processing chamber and may also operate as a gas distribution plate for delivering one or more precursors into processing region 308 for contacting substrate 306. Accordingly, in some embodiments, plasma source 310 may at least partially define processing region 308 from above, and may provide fluid communication into the processing region within the processing chamber. For example, one or more precursors may be delivered through one or more inlets into the chamber as illustrated. As noted above, any number of additional components may be included to facilitate uniform distribution through the chamber, and which may operate as a choke or baffle to facilitate radial and/or lateral distribution of precursors. Plasma source 310 may define one or more apertures 312 extending through the source, and which may finally distribute precursors for operation on substrate 306, such as etching or deposition, or other treatment operations, for example.

Figure 4:
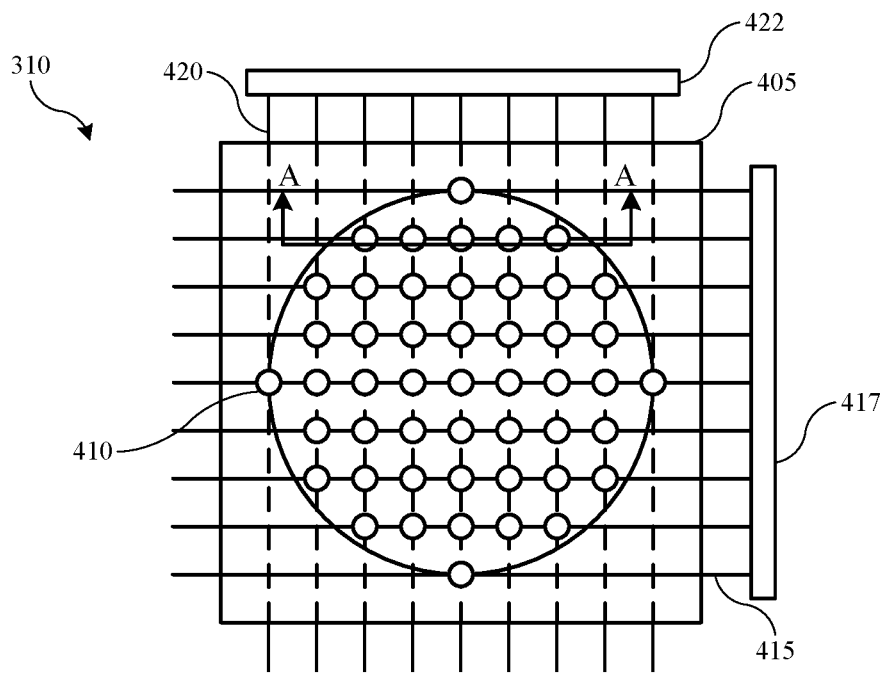
FIG. 4 shows a schematic top view of an exemplary plasma source according to some embodiments of the present technology.

Plasma source 310 may include one or more electrodes that may be operated to produce plasma within the apertures 312 defined through the plasma source. As will be explained further below, by utilizing one or more electrodes, each aperture may operate as a cell that may be operated independently from any other cell, or may be operated in conjunction across the source. FIG. 4 shows a schematic top view of an exemplary plasma source 310 according to some embodiments of the present technology, and may illustrate a schematic view illustrating some components and configurations of dielectric barrier discharge plasma sources according to some embodiments of the present technology.

Plasma source 310 may include a source substrate 405 through which one or more, including a plurality, or apertures 410 may be defined. Source substrate 405 may include one or more plates as will be described further below, and may be characterized by any number of geometries. For example, source substrate 405 may be characterized by a rectilinear geometry as illustrated, as well as any elliptical or arcuate geometries, as well as any other geometries that may facilitate incorporation within a substrate processing chamber. Source substrate 405 may be or include any number of materials including dielectric materials in some embodiments. For example, source substrate 405 may be or include any number of dielectric or ceramic materials, such as one or more oxide, nitride, or carbide, carbonate, or other base materials. The materials may include silicon, carbon, aluminum, sodium, magnesium, tungsten, yttrium, zirconium, or any combination of these or other elements, such as transition metal elements, which may operate or withstand a processing environment within a semiconductor processing chamber.

The apertures 410 defined through the plasma source may be arranged in any pattern, which may include a grid of some type as illustrated. For example, the apertures in exemplary plasma source 310 may be arranged about the circular projection illustrated on the source substrate 405, which may show the location of a substrate positioned downstream of the plasma source, such as substrate 306 described above. The apertures may be defined in any number of patterns, which may also be rectilinear for associated substrates, or any other pattern that may afford distribution of precursors to a substrate processing region for interaction with a substrate being processed. Additionally, although illustrated in an XY grid pattern based on electrode location as will be described below, additional or alternative distributions may also be utilized including radial distributions, which may be formed along an r, θ or polar coordinate system, among any other arrangement of aspects of the plasma source. The included apertures are not intended to be limiting of any number of apertures incorporated within exemplary sources, and which may extend beyond or within areas corresponding to substrates being processed, or any other arrangement of apertures. Exemplary plasma sources may include one or more apertures through the sources, and may include tens, hundreds, or thousands of apertures defined through sources of any range of dimensions of substrates for semiconductor processing, including from a few hundred millimeters or less, to several meters or more. The apertures 410 may be formed to any size or diameter, and may be characterized by a consistent or varying diameter across a plasma source. In some embodiments the apertures 410 may be characterized by a diameter of less than or about 10 mm, and may be characterized by a diameter of less than or about 9 mm, less than or about 8 mm, less than or about 7 mm, less than or about 6 mm, less than or about 5 mm, less than or about 4 mm, less than or about 3 mm, less than or about 2 mm, or less.

Plasma source 310 may also include one or more, including a plurality, of electrodes extending across the source substrate 405, and intersecting one or more apertures 410 defined through the source. The electrodes may be operated in embodiments to produce an electrical discharge within the apertures through the source, and which may produce a number of plasma cells through which one or more precursors may be delivered and plasma enhanced. The electrodes may include a first set of electrodes, including one or more first electrodes 415, and a second set of electrodes, including one or more second electrodes 420. The second electrodes may be arranged at an angular offset from the first electrodes in some embodiments, including being disposed perpendicular to the first electrodes as illustrated. Second electrodes 420 are illustrated in hidden view as the second electrodes may be disposed at a different plane through the plasma source from first electrodes 415. For example, in some embodiments, although second electrodes 420 may overlap first electrodes 415, the second electrodes may be maintained physically separated from each of the first electrodes 415. Each of the first electrodes 415 and each of the second electrodes 420 may be physically and/or electrically isolated from any other electrode of the plasma source 310, which may allow independent operation of electrodes according to some embodiments of the present technology. Similar to the apertures, exemplary plasma sources according to embodiments of the present technology may include any number of first electrodes and second electrodes, including one or more, and which may include tens, hundreds, or thousands of electrodes in embodiments of the present technology.

First electrodes 415 may be coupled with a first power supply 417 and second electrodes 420 may be coupled with a second power supply 422 as illustrated. Either or both power supplies may be operated by controller 191, or some other system controller as will be described below. The coupling may include the electrodes extending off the substrate in some embodiments, and/or may include extensions of the power supplies contacting the electrode material on the source substrate. An additional electrical connection may be included on the opposite side of the source substrate from each power supply, or some other electrical coupling that may facilitate voltage delivery along each individual electrode. In some embodiments, first power supply 417 and second power supply 422 may be a single power source providing a number of different outputs, as well as the capability to provide different voltages across differently coupled electrodes. Whether a single power source or multiple power sources, the power sources may be electrically coupled with the electrodes to provide voltages across the electrodes. The power sources may have multiplexing capabilities, which may allow a voltage to be applied to any individual electrode coupled with the power supply, and which may afford delivery of a single voltage or a range of voltages in some embodiments. In some embodiments first power supply 417 may be configured to deliver a first voltage along the one or more first electrodes 415, and the second power supply 422 may be configured to deliver a second voltage along the one or more second electrodes 420.

The voltages from either power supply may be in any range or may encompass any voltage, although in some embodiments each of the first power supply and the second power supply may be configured to deliver voltages of less than or about 500 V along any electrode with which it may be electrically coupled. The voltage delivered may be relative to a breakdown voltage between any overlapping first electrode and second electrode, as will be described further below. For example, although each power supply may deliver a similar voltage or any voltage within a range, in some embodiments the first power supply may be configured to deliver or provide a first voltage along each of the first electrodes, and the second power supply may be configured to deliver or provide a second voltage along each of the second electrodes that may be less than the first voltage. Again, in some embodiments a single power supply may be utilized which may be configured to deliver the separate voltages as described. Accordingly, and as will be described further below, the electrodes may be operated in both an addressing and sustaining function in embodiments of the present technology to produce plasma discharge pulses within each individual plasma cell through the plasma source. Electrodes according to the present technology may be or include any number of conductive materials printed or formed across the source substrate. For example, copper, tungsten, molybdenum, nickel, iron, silver, cobalt, gold, or any other metal, including transition metals, may be used as electrodes in some embodiments of the present technology. A number of material combinations or alloys may similarly be used, including nickel-cobalt ferrous alloys, as one non-limiting example, as well as these materials with an additional layer of conductive material deposited on one or more surfaces.

Figure 5:
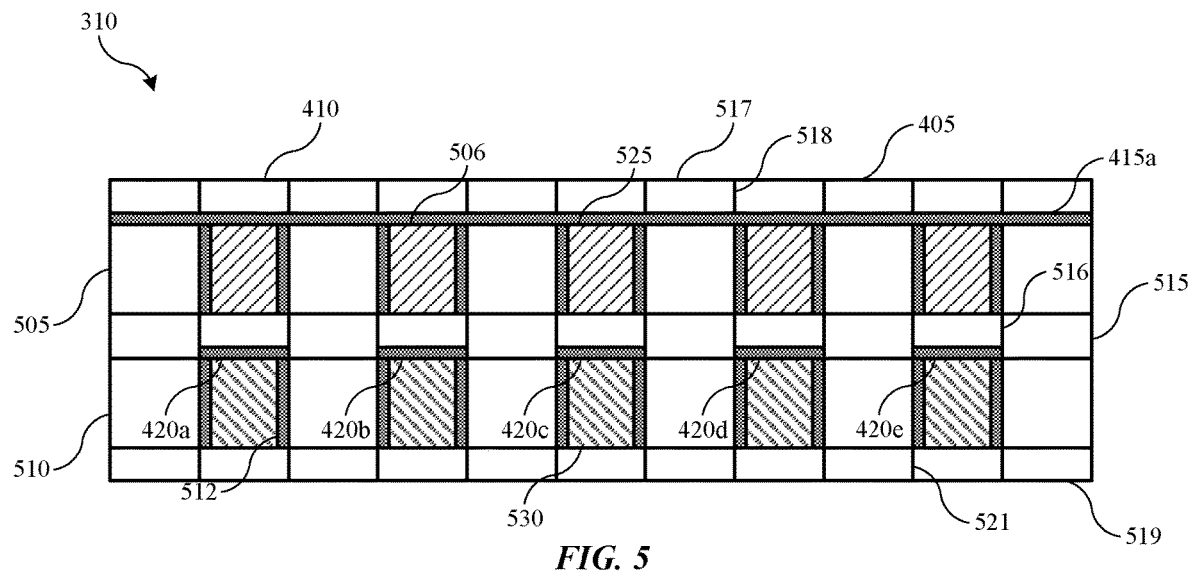
FIG. 5 shows a schematic partial cross-sectional view of an exemplary plasma source through line A-A of FIG. 4 according to some embodiments of the present technology.

Turning to FIG. 5 is shown a partial schematic cross-sectional view of exemplary plasma source 310 through line A-A of FIG. 4 according to some embodiments of the present technology. It is to be understood that the source is not to be considered to any particular scale, and may include any number of apertures and electrodes as previously described. For example, plasma source 310 may include a source substrate 405 having one or more apertures 410 defined therethrough. Plasma source 310 may also include a set of first electrodes 415 and a set of second electrodes 420 as illustrated. It is to be understood that any number of apertures and electrodes may be included with plasma source 310 as described above.

As illustrated in the figure, plasma source 310 may include one or more plates to produce source substrate 405 in some embodiments of the present technology. The plates may be adhered, bonded, sintered, mechanically joined, or otherwise coupled with one another to produce the plasma source 310. In some embodiments each plate of the one or more plates may be the same material as all other plates in the source, although in some embodiments different materials may be used for different plates. For example, in some embodiments a first plate 505 and a second plate 510 may be the same or different materials, and each of first plate 505 and second plate 510 may be the same or different materials from a third plate 515 disposed between the first plate and the second plate. Any plate of source substrate 405 may be any of the materials described previously.

As illustrated, plasma source 310 may include a number of plates coupled, or formed together to produce a monolith in some embodiments. Any of the plates may include a dielectric or ceramic material as previously described. Plasma source 310 may include a first plate defining one or more, including a first plurality, of apertures 506 defined through the first plate. The apertures may be included in any number of arrangements as described previously, including in a first set of rows, with a single row being illustrated, with the additional rows shown in FIG. 4 above. The first plate may also include one or more, including a first set, of electrodes 415, with one electrode 415a illustrated in the cross section shown. The first set of electrodes 415 may be distributed along the first set of rows, and each electrode of the first set of electrodes may intersect at least one of the apertures of the first plurality of apertures 506.

Plasma source 310 may include a second plate 510 defining one or more, including a second plurality, of apertures 512 defined through the second plate. The apertures may be arranged in any number of arrangements, including a second set of rows, which may be similar or identical to the first set of rows in some embodiments. As illustrated, each second aperture 512 may be axially aligned or coaxial with a first aperture 506, and in some embodiments second plate 510 may define the same number of apertures as first plate 505. Plasma source 310 may also include a third plate 515 positioned between the first plate 505 and the second plate 510. Third plate 515 may define one or more, including a third plurality, of apertures 516. The third plate 515 may define the same number of apertures as the other plates, and each third aperture 516 may be axially aligned or coaxial with a corresponding first aperture 506 and/or a corresponding second aperture 512. As illustrated, each axially aligned aperture of the first apertures 506, the second apertures 512, and the third apertures 516 may form a channel that extends through the plasma source 310. Each of these channels may be an individual plasma cell, which may individually have plasma formed within the channel by operation of the electrodes.

Plasma source 310 may include one or more, including a second set, of electrodes 420, which may extend perpendicularly or at some other angular offset from the first electrodes 415. Hence, electrodes 420 may be extending through the page in the orientation illustrated, with electrodes 420a, 420b, 420c, 420d, and 420e illustrated in the cross section shown. The second set of electrodes 420 may be distributed along the second set of rows, and each electrode of the second set of electrodes may intersect at least one of the apertures of the plurality of second apertures 512. Each of the first electrodes 415 and each of the second electrodes 420 may separately extend along an individual row across the source substrate, and may be formed in stripes, which may limit or prevent contact between any two electrodes across the plasma source. Hence, with each plate of the source being a dielectric material in some embodiments, each electrode may be electrically, and or physically, isolated from each other electrode on the substrate. Of course, any amount of electrical coupling may occur at the power supplies in some configurations encompassed by the present technology.

In some embodiments one or more additional plates may be included with the plasma source, and which may encase or protect aspects of the plasma source in some embodiments of the present technology. For example, a fourth plate 517 may be coupled with a surface of the first plate 505 opposite a surface of the first plate 505 coupled with the third plate 515. Fourth plate 517 may define one or more, including a fourth plurality, of apertures 518, which may be axially aligned with the apertures of the first plate 505 and the second plate 510. A fifth plate 519 may be coupled with a surface of the second plate 510 opposite a surface of the second plate 510 coupled with the third plate 515. Fifth plate 519 may define one or more, including a fifth plurality of apertures 521, which may be axially aligned with the apertures of the first plate 505 and the second plate 510. Fourth plate 517 and fifth plate 519 may be made from any of the materials previously described, and may be the same or different materials from any of the other plates. The plates may provide physical and or chemical protection to the other plates of the plasma source during semiconductor processing. Additionally, in some embodiments, fourth plate 517 and fifth plate 519 may be a coating applied along the first plate and third plate, which may be a dielectric or other protective coating, which may be spray coated or otherwise applied across the plasma source.

As described previously, first electrodes 415 and second electrodes 420 may be formed on different planes through the plasma source, which may prevent shorting between the electrodes. For example, first electrodes 415 may be formed on a first surface of the first plate 505, and second electrodes 420 may be formed on a first surface of the second plate 510. Although illustrated above the plates, it is to be understood that electrodes according to the present technology may be on the order of several micrometers or less, and may be fully contained by a plate covering the electrodes. Additionally, in some embodiments trenches may be formed in the first surface of the first plate 505 and the second plate 510 in a location corresponding to each row or pattern, and an electrode material may be formed or deposited within the trenches.

For operation during plasma processing, the electrodes may further extend along sidewalls of the apertures intersected by each electrode, which may maintain continuity along each electrode through each aperture, and may facilitate formation of the individual plasma cells. Accordingly, each electrode may include an annular component extending about an interior of each aperture intersected by the electrode. As shown in the figure, first electrode 415a, along with each other first electrode 415, may extend along a first surface of first plate 505, and may further extend along the sidewalls of each aperture 506 formed through the plate and intersected by the associated electrode 415. Similarly, second electrodes 420, including each individual second electrode illustrated, may extend along a surface of the second plate 510, and may further extend along the sidewalls of each aperture 512 formed through the plate and intersected by the associated electrode 420. The electrode material may extend fully or partially through the apertures, and in some embodiments may uniformly be formed through the apertures from the first surface of the plate along which the electrode is formed, to a second surface opposite the first. The electrode material may also be formed to any thickness within the apertures, including to a thickness of less than or about 100 µm, and may be formed to a thickness of less than or about 80 µm, less than or about 60 µm, less than or about 50 µm, less than or about 40 µm, less than or about 30 µm, less than or about 20 µm, less than or about 10 µm, less than or about 5 µm, or less. The separation between the first electrode 415 and the second electrode 420 within each channel or plasma cell may be controlled by the thickness of plate 515. This gap may define a space for electrical discharge between the two electrodes.

In embodiments of the present technology any of the plates of source 310 may be characterized by a thickness of less than or about 1 cm, and may be characterized by a thickness of less than or about 9 mm, less than or about 8 mm, less than or about 7 mm, less than or about 6 mm, less than or about 5 mm, less than or about 4 mm, less than or about 3 mm, less than or about 2 mm, less than or about 1 mm, less than or about 0.5 mm, or less. For example, third plate 515 may be sized to a thickness according to a pressure regime in which the plasma source may be operated at a particular voltage. For example, in one non-limiting example, a plasma source operated at a voltage between about 100 V and about 300 V, and at a pressure of from about 5 Torr to about 50 Torr, may include a third plate characterized by a thickness of between about 3 mm and about 5 mm in some embodiments.

To facilitate operation as plasma generating electrodes, a dielectric material may be formed overlying the electrode material in some embodiments. Although the dielectric material may be formed fully over the electrode material across a plate of the plasma source, in some embodiments the dielectric material may be formed overlying electrode material extending along sidewalls of each aperture of the plate as illustrated. For example, a first dielectric material 525 may be formed overlying electrode material formed along sidewalls of each aperture through first plate 505. Additionally, a second dielectric material 530 may be formed overlying electrode material formed along sidewalls of each aperture through second plate 510. The first dielectric material 525 and the second dielectric material 530 may be the same or different materials, and may be any of the dielectric materials previously described. The dielectric materials may also be formed to any of the thickness described elsewhere for electrodes, apertures, or any other thickness or dimension noted. It is to be understood that although the figure illustrates the dielectric material contained within the aperture, to illustrate the continuity of the electrode stripes, in some embodiments the dielectric material may extend about any exposed electrode material through the channels or plasma cells of the source, and thus in some embodiments no portion of the electrode materials may be exposed through the apertures 410 extending through the source.

In some embodiments the dielectric materials may be the same materials of the corresponding plate, although in some embodiments the dielectric material may be different from the plate material. As one non-limiting example, first plate 505 may be formed of a first dielectric material, such as aluminum oxide, and dielectric material 525 may be a different dielectric material, such as magnesium oxide, although any of the previously noted materials may be utilized for any of the materials of any plate or dielectric material, although the material selected and thickness to which the dielectric material is formed may affect the voltage at which breakdown may occur for generating an electrical discharge within the plasma cell. By providing a first voltage across a first electrode, and by providing a second voltage across a second electrode overlapping the first electrode at a particular channel or plasma cell formed through the source, an electrical discharge may be formed within the plasma cell, which may afford plasma excitation of a precursor delivered through the aperture. Operation of the plasma cells will be described further below.

Figure 6:
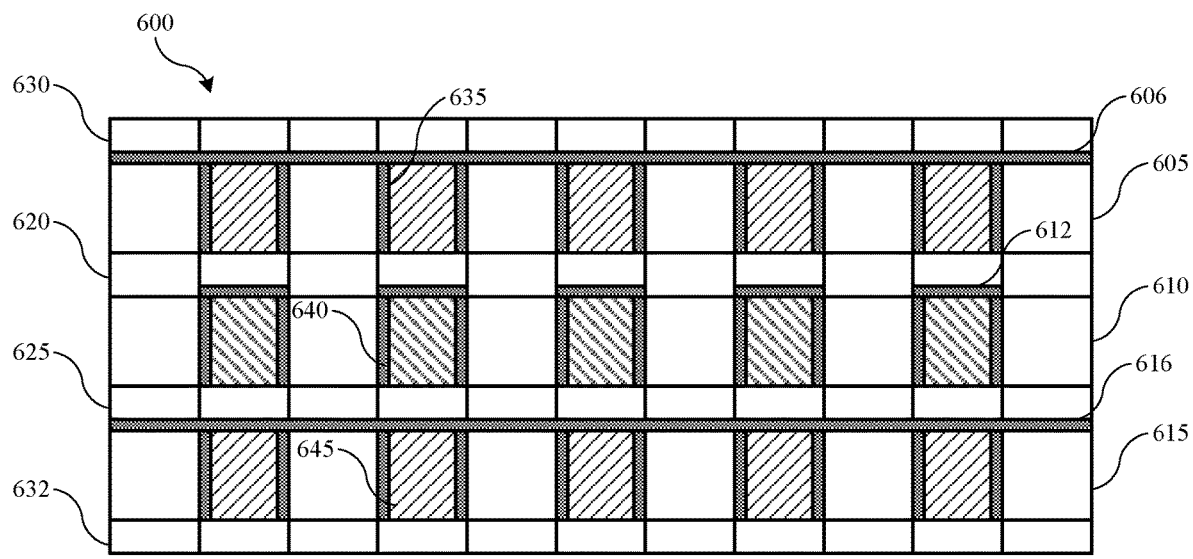
FIG. 6 shows a schematic cross-sectional view of an exemplary plasma source according to some embodiments of the present technology.

FIG. 6 shows a schematic cross-sectional view of an exemplary plasma source 600 according to some embodiments of the present technology. Plasma source 310 described above illustrated a configuration of a two-dimensional electrode configuration encompassed by some embodiments of the present technology. Additional plasma sources encompassed by the present technology may include a one-dimensional electrode configuration, a three-dimensional electrode configuration, or any number of configurations including additional electrodes. For example, plasma source 600 may illustrate a three-electrode plasma source, which may include multiple sustain electrodes with an addressing electrode formed there between.

Plasma source 600 may include any of the features, characteristics, or components of any plasma source previously described, including plasma source 310. Similarly, plasma source 600 may be included in any system or processing chamber previously described, as well as any other processing chamber in which plasma processing may be performed. Plasma source 600 may include an arrangement similar to plasma source 310, in some embodiments, with an additional plate of the plasma source, and having an additional electrode, incorporated with the source. For example, plasma source 600 may include a first plate 605, a second plate 610, and a third plate 615 coupled together. A fourth plate 620 may be disposed between the first plate 605 and the second plate 610, and a fifth plate 625 may be disposed between the second plate 610 and the third plate 615. An additional sixth plate 630 and a seventh plate 632, which may additionally be coatings, may be included encompassing the other plates, such as coupled with opposite ends of the first plate and third plate as illustrated, and which may provide protection or enclosure of the plasma source.

A first electrode 606, or first set of electrodes, may extend across the first plate in a first direction, or first arrangement, intersecting one or more apertures through the plate. A second electrode 612, or second set of electrodes, may extend across the second plate in a second direction which may be perpendicular to the first direction, or second arrangement, intersecting one or more apertures through the plate. Additionally, a third electrode 616, or third set of electrodes, may extend across the third plate in the first direction such as similar to the direction along the first plate, or third arrangement, intersecting one or more apertures through the plate. In this arrangement, each of the first electrode and third electrode formed in parallel may operate as a sustain electrode, which may provide additional electrical efficiency during operation of the plasma source.

Figure 7:
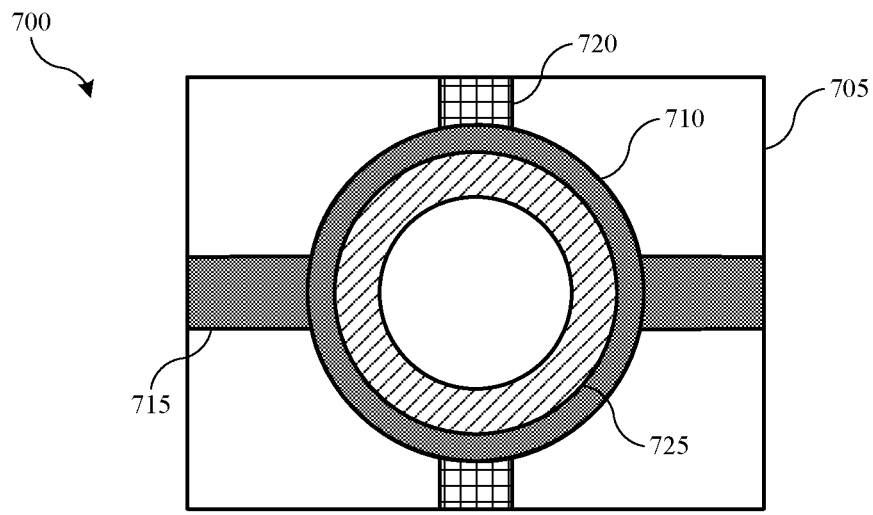
FIG. 7 shows a schematic top view through an exemplary cell of a plasma source according to some embodiments of the present technology.

FIG. 7 shows a schematic top view through an exemplary cell of a plasma source 700 according to some embodiments of the present technology, and may illustrate the layered components for the electrode through the aperture. Plasma source 700 may include any of the features, characteristics, or components of any plasma source previously described, including plasma source 310. Similarly, plasma source 700 may be included in any system or processing chamber previously described, as well as any other processing chamber in which plasma processing may be performed.

As illustrated, plasma source 700 may include a source substrate 705 through which an aperture 710, or plasma cell, may be defined. A first electrode 715 may extend along a first surface, such as along a first plate, of plasma source 700, and may be included within the source as described above, such as formed between plates, or encompassed by dielectric material. First electrode 715 may extend in a stripe along the source, and may be one of a number of electrodes included across the source. A second electrode 720 may extend along a second surface of the source, including within the source as described above, or encompassed within dielectric material. The electrodes may be formed in different planes, including along different portions of the aperture 710 formed through the source. As illustrated, electrode 715, and similarly electrode 720, may extend along a surface of the source, as well as along sidewalls of the aperture 710 formed through the substrate. The electrodes may then include an annular component extending along the apertures to provide a continuity along each aperture intersected by the electrode.

As previously described, a dielectric material 725 may be formed over portions of the electrode formed along sidewalls of the aperture 710. The dielectric material may facilitate dielectric barrier discharge between the first electrode 715 and the second electrode 720 within the aperture through the source. Although illustrated along only the interior sidewalls overlying the electrode material, where the electrode material is disposed between the source substrate 705 and the dielectric material 725, it is to be understood that in some embodiments the dielectric material may extend outside of the aperture, and may overly the entire annular portion of the electrode to limit or prevent exposure of any electrode material within the aperture or plasma cell.

Figure 8:
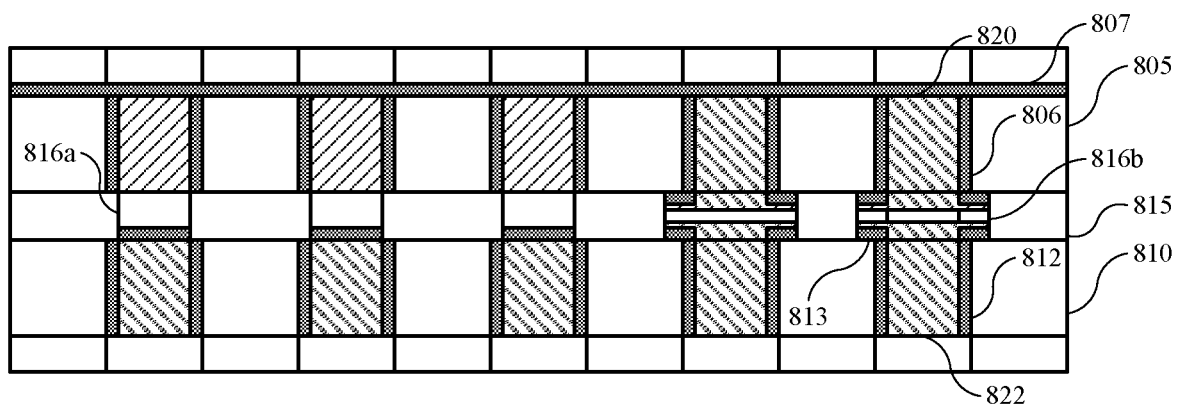
FIG. 8 shows a schematic cross-sectional view of an exemplary plasma source according to some embodiments of the present technology.

FIG. 8 shows a schematic cross-sectional view of an exemplary plasma source 800 according to some embodiments of the present technology, and may illustrate variations in aperture profiles through the source. Plasma source 800 may include any of the features, characteristics, or components of any plasma source previously described, including plasma source 310. Similarly, plasma source 800 may be included in any system or processing chamber previously described, as well as any other processing chamber in which plasma processing may be performed.

Plasma source 800 may include features similar to plasma source 310 as illustrated in FIG. 5 above, and may include some or all of those components, including a first plate 805 through which first apertures 806 may be defined, a second plate 810 through which second apertures 812 may be defined, and a third plate 815 through which third apertures 816 may be defined. A set of first electrodes 807 may extend across a surface of first plate 805, and a set of second electrodes 813 may extend across a surface of second plate 810. As noted previously, each first aperture may be coaxial with an associated second aperture and third aperture to define a channel or plasma cell through the source 800. Any of the apertures of any of the plates may be characterized by any of the aperture diameters described above, and in some embodiments, at least one of the plates may define apertures of a different diameter of one or all of the other plates of the source.

For example, source 800 illustrates two additional aperture profiles, which may be included separately or in combination with any other aperture profile through sources encompassed by embodiments of the present technology, and may illustrate embodiments of aperture profiles for any plasma source described throughout the present disclosure. For example, both aperture profiles include plasma cells where the first apertures 806 are characterized by a first diameter, and where third apertures 816 are characterized by a second diameter different from the first. As illustrated in the first example encompassed by the figure, third apertures 816*a* are characterized by a diameter less than a diameter of first apertures 806. By effectively increasing the amount of material formed between first electrode 807 and second electrode 813, the source may be configured to operate at lower pressure regimes, which may extend below or about 5 Torr in some embodiments. Additionally, increasing the gap distance may increase the voltage to discharge within the plasma cell.

In the second example encompassed by the figure, third apertures 816*b* are characterized by a diameter greater than a diameter of first apertures 806. Additionally, electrode material 807 may extend across a first surface of first plate 805 as illustrated, and in the stripes described previously. Electrode material 807 may also extend across a second surface of first plate 805 opposite the first surface, such as within the gap between the first plate and the second plate occupied by the third plate. Similarly, electrode material 813 may be formed along a first surface of second plate 810, and may be formed in an increased annular lip or extension about the apertures 812 as illustrated. The extension of both the first electrode material 807 and the second electrode material 813 may occur to the same extent on the facing surfaces. Additionally, dielectric material 820 formed through the first apertures 806, and dielectric material 822 formed through the second apertures 812, may further extend about the additional electrode material as illustrated.

For example, the dielectric material may extend within the gap overlying the additional electrode material to limit or prevent exposure of either electrode, which may occur on the first surface of the first plate as well to limit or prevent exposure of electrode material within the plasma cell. By effectively reducing the amount of material and the gap formed between first electrode 807 and second electrode 813, the source may be configured to operate at higher pressure regimes, which may extend above or about 5 Torr in some embodiments, and may extend to pressures greater than or about 10 Torr, greater than or about 15 Torr, greater than or about 20 Torr, greater than or about 25 Torr, greater than or about 30 Torr, greater than or about 35 Torr, greater than or about 40 Torr, greater than or about 45 Torr, greater than or about 50 Torr, or higher. Additionally, increasing the gap distance may reduce the voltage to discharge within the plasma cell in some embodiments.

The previously described sources may be operated to produce plasma enhanced precursors for use in semiconductor processing. The plasma cells formed through the sources may allow independently developed plasma profiles that can impact the substrate-level performance of the process being produced. By utilizing addressing and sustaining plasma functions at each plasma cell, and by adjusting the number of plasma pulses occurring at each cell during the sustaining functions, the amount of deposition material, etchant, or treatment material produced in each plasma cell through the source may be specifically tailored to improve process uniformity at the substrate level.

Figure 9:
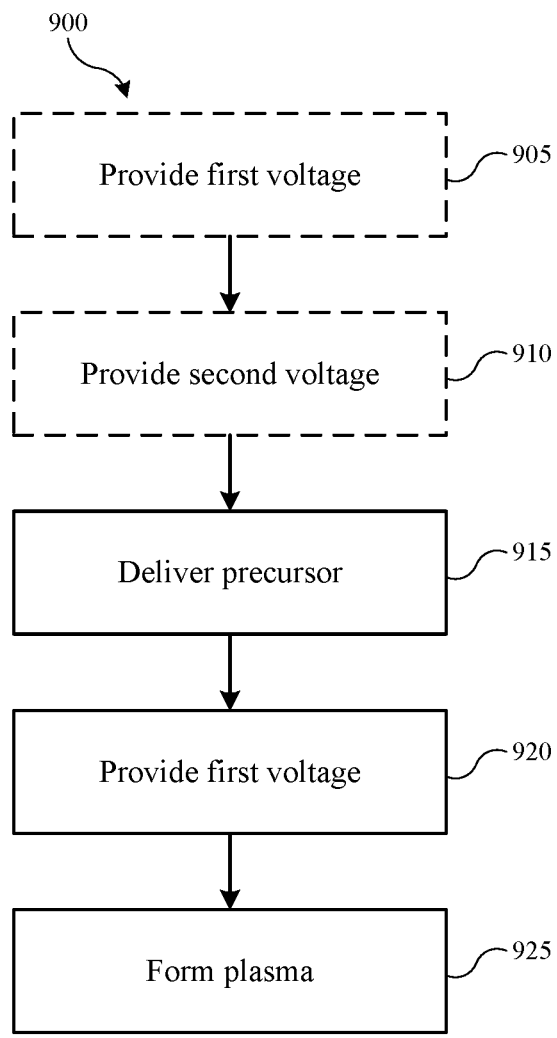
FIG. 9 shows selected operations in a method of processing a semiconductor substrate according to some embodiments of the present technology.

FIG. 9 shows selected operations in a method 900 of processing a semiconductor substrate according to some embodiments of the present technology. The method may be performed in a variety of processing chambers, including processing system 300 described above, which may include plasma sources according to embodiments of the present technology, such as any component, configuration, or characteristic of any plasma source discussed previously. Method 900 may include a number of optional operations, which may or may not be specifically associated with some embodiments of methods according to the present technology. An exemplary etching process may be described in conjunction with the operations of method 900 for ease of understanding, although it is to be understood that the process is not intended to be limiting, and any number of etching, deposition, treatment, or cleaning operations may similarly be performed according to method 900 and variations similarly encompassed by the present technology.

The method 900 may be performed in a processing chamber including a plasma source as previously described. The plasma source may include one or more apertures through the source, as well as a set of first electrodes, and a set of second electrodes. One or more power supplies may be included and configured to deliver a first voltage along each electrode of the set of first electrodes, and deliver a second voltage along each electrode of the set of second electrodes. In the exemplary embodiment, the source may be formed with electrode and dielectric materials and thicknesses to produce an electrical discharge within each plasma cell at 250 V. It is to be understood that these materials and configurations may be adjusted to produce discharge within any range of voltages as previously described. Additionally, although the power supplies may be configured to deliver any voltage within a range of voltages as previously described, each power supply may be specifically configured to deliver a voltage that is less than the voltage at which electrical discharge may occur within each cell at the specified operating conditions. The power supplies may also be configured in combination to deliver a voltage that together may be greater than voltage at which electrical discharge may occur.

Continuing the non-limiting example, the first power supply may be configured to deliver a first voltage that may be less than or about 250 V, and may be 200 V, although any number of other voltages within this range may be selected. The first electrodes may be sustain electrodes, for example. Additionally, the second power supply may be configured to deliver a second voltage that may be less than or about 250 V, and may be 80 V, although any number of other voltages within this range may be selected. The second electrodes may be address electrodes, for example. Accordingly, when either power supply delivers a voltage along a particular electrode, there may be no discharge effect within any individual plasma cell. However, when an overlapping electrode similarly receives a voltage, the plasma cell or channel at which the electrodes overlap, may receive a voltage greater than the voltage at which discharge may occur between the two electrodes, and a hence, electrical discharge may occur within that cell, without occurring in any other cell along either electrode, for example. By coordinating delivery of power along each of the first electrodes, and each of the second electrodes, plasma may be independently produced within each channel or plasma cell of the source.

The control scheme for producing the plasma may occur by using a control, such as a system controller as previously described to address each plasma cell of the source, and then sustaining the cells under a pulsing scheme that may produce the processing profile on the substrate as desired. Addressing cells may involve providing a voltage along the corresponding electrodes that provides a net voltage above the cell breakdown voltage. For example, at optional operation 905, a first voltage, such as 200 V in the example, may be delivered along each of the first electrodes, similar to a scan function of a multiplexer. Additionally, at optional operation 910, a second voltage, such as 80 V in the same example, may be delivered along selected second electrodes, including all electrodes, to exceed the breakdown voltage at each cell where the electrodes receiving voltage overlap. This may be performed with a precursor for a subsequent processing operation, an inert precursor or carrier precursor, or within the environment of the processing chamber. Accordingly, at least some overlap between voltage delivered along first electrodes and voltage delivered along second electrodes may occur to produce a discharge in one or more plasma cells, including all plasma cells, of the source.

When discharge occurs within a particular plasma cell during the addressing operation, a surface charge remains on the dielectric layers of the two electrodes. This surface charge may be less than the cell breakdown voltage, but may be greater than the difference between the cell breakdown voltage and the voltage provided along the sustain electrodes. A precursor for semiconductor processing may be delivered at operation 915, and may be delivered into a semiconductor processing chamber incorporating a plasma source, such as any plasma source described throughout the present disclosure. The precursor may flow through the chamber and may be distributed through the channels or plasma cells of the plasma source, which may also be a gas distribution plate, before being delivered to the processing region to interact with a substrate. As the precursor is being delivered through the plasma cells of the source, the first power supply may deliver the first voltage, such as 200 V continuing the example, along the first electrodes, or sustain electrodes, at operation 920. The voltage due to the memory charge on the dielectric surfaces within the plasma cells of the source that were previously addressed may then add to the applied voltage of the sustain electrodes, which may again exceed the cell breakdown voltage, causing an additional discharge pulse of plasma only within the cells that were addressed previously. This may form plasma within the individual channels or plasma cells through the plasma source at operation 925, and which may produce a plasma enhanced precursor as it flows through the source. The precursor, which may include one or more precursors, may then interact with the substrate to perform the substrate processing.

If all plasma cells are characterized by similar dimensions, and the voltage applied across each electrode is the same, the plasma power produced within each cell may be proportional to a number of discharge pulses occurring within each cell during a cycle of operation. At each cycle, the individual plasma cells may be reset, and then re-addressed, which may adjust the cells receiving a memory charge. When a cell does not receive a memory charge in the addressing cycle, the cell will not discharge during the subsequent sustain cycles. Because cycles can occur in milliseconds or microseconds, the number of pulses that may occur at each cell during a processing operation of a few seconds or a few minutes, may be hundreds, thousands, tens of thousands, or hundreds of thousands of pulses of plasma. Consequently, by tuning the number of pulses that a particular cell receives, the process being performed on a substrate may be tuned in a feed-forward loop.

For example, a process, such as an etching process may be performed on a substrate housed in a chamber incorporating a plasma source as previously described. It is to be understood that exemplary deposition, treatment, cleaning, or other operations may similarly be performed. The etching process may occur over a period of time, during which the plasma cells may be operated so that each plasma cell discharges a certain number of times during the period of time. As one non-limiting example, each plasma cell may be operated to discharge 10,000 times during the period of time, although any number of pulses may be configured based at least in part on the frequency of the power supply. Theoretically, the etch process performed should occur uniformly across the substrate, but this does not always occur. For example, due to non-uniformity of flow of precursors within the processing chamber, non-uniformity of temperature distribution across the substrate, or any other number of factors, the etch process may produce a profile across the substrate.

Subsequent performance of the etch process, a metrology or other analysis may be performed to identify any non-uniformity of the process, such as an edge-high profile, a center-high profile, a radial or planar non-uniformity, or some combination of these issues. For example, analysis may determine that etching was performed more readily in the center of the substrate than on the edges producing an edge-high profile. In response, processing may be adjusted to either reduce the center etching, increase the edge etching, or both. By adjusting the number of discharge pulses per plasma cell of the plasma source, increased or reduced etchant precursor may be produced through different regions of the plasma source, which may provide the changes sought.

To produce these effects in the source, the addressing scheme may be modified for the plasma cell. For example, while every plasma cell in the source may still be operated throughout the processing time, the number of discharge pulses produced in each cell may be adjusted through an addressing scheme. To produce the addressing scheme, for example, a number of subfields may be produced as a set of frames throughout the processing time. A digital controller or aspect of a system controller may produce the addressing and sustaining scheme for each subfield and frame across the processing time period. At the beginning of each subfield time period, each plasma cell may be addressed as previously described to maintain or lose a memory charge. During the subsequent sustain pulses, for each subfield time period, only the cells maintaining a memory charge may be further discharged, which may allow an adjustment to the plasma intensity within each plasma cell during each frame of the processing time.

Continuing the etching example above, by increasing the number of discharge pulses at plasma cells about an external periphery of the plasma source, and/or by reducing the number of discharge pulses at plasma cells about a central region of the plasma source, the plasma intensity may be relatively increased at a radial edge of the processing region, and the plasma intensity may be relatively reduced at central region of the processing region. This may increase etching at an edge region, and may reduce etching at a center region. In terms of pulses, each cell across the source may continue to receive greater than or about 50% of the total number of pulses producible during an operational time period, and may continue to receive greater than or about 60% of the total number of pulses, greater than or about 70% of the total number of pulses, greater than or about 80% of the total number of pulses, greater than or about 90% of the total number of pulses, greater than or about 95% of the total number of pulses, greater than or about 99% of the total number of pulses, or more, depending on the variation sought in the process being performed.

For example, while plasma cells at a mid-region of the source may receive 9,000 discharge pulses across the processing time, plasma cells at the central region of the source may receive 8,000 discharge pulses across the processing time, and plasma cells at the radial edge region of the source may receive 10,000 discharge pulses across the processing time. Of course, any number of variations across the source and individual plasma cells is similarly encompassed, as each individual cell may be independently tuned across the source to provide complex plasma profiles that may accommodate process non-uniformity from any number of sources.

For example, processing of the imaging data and subsequent adjustments to addressing schemes that overcome or accommodate non-uniformity of processes may be used to generate or initiate a library of results or outcomes that may facilitate future processes. This generated library may be accessed by a processor for machine learning, where an algorithm may be implemented to identify patterns from processing scenarios, which may provide a machine learning model to facilitate predictive adjustments to processing or chamber conditions. Algorithms may include consideration of chamber conditions, process conditions, materials or properties for components of the system, addressing schemes, effect on processing per adjustments to discharge pulses, among any number of other considerations that may be collected during processing and analyzed to train the machine learning model. Deep machine learning algorithms may be developed for pulsing schemes or addressing operations based on the number of plasma cells within a particular source.

The machine learning may further populate the data library and iteratively improve predictions for any number of chamber or processing scenarios. Consequently, over time the model may control processing by predicting effects based on previously received or modeled image data of processing and adjustments to total number of discharge pulses for individual plasma cells, and may adjust any number of processing parameters in situ to increase or decrease discharge pulses for each plasma cell across the plasma source, and improve process outcomes and uniformity of operations. By utilizing individually addressable plasma cells in a plasma source according to some embodiments of the present technology, improved plasma processing may be performed at higher pressure and lower voltage than with many conventional processing chambers.

One or more computing devices or components may be adapted to provide some of the desired functionality described throughout by accessing software instructions rendered in a computer-readable form. The computing devices may process or access signals for operation of one or more of the components of the present technology, such as the addressing individual cells across the plasma source during each subfield of each frame of processing time, for example. When software is used, any suitable programming, scripting, or other type of language or combinations of languages may be used to perform the processes described. However, software need not be used exclusively, or at all. For example, some embodiments of the present technology described above may also be implemented by hard-wired logic or other circuitry, including but not limited to application-specific circuits. Combinations of computer-executed software and hard-wired logic or other circuitry may be suitable as well.

Some embodiments of the present technology may be executed by one or more suitable computing device adapted to perform one or more operations discussed previously. As noted above, such devices may access one or more computer-readable media that embody computer-readable instructions which, when executed by at least one processor that may be incorporated in the devices, cause the at least one processor to implement one or more aspects of the present technology. Additionally or alternatively, the computing devices may include circuitry that renders the devices operative to implement one or more of the methods or operations described.

Any suitable computer-readable medium or media may be used to implement or practice one or more aspects of the present technology, including but not limited to, diskettes, drives, and other magnetic-based storage media, optical storage media, including disks such as CD-ROMS, DVD-ROMS, or variants thereof, flash, RAM, ROM, and other memory devices, and the like.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "an electrode" includes a plurality of such electrodes, and reference to "the plasma cell" includes reference to one or more plasma cells and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A plasma source comprising:
a first plate defining a first plurality of apertures arranged in a first set of rows and extending from a first surface of the first plate to a second surface of the first plate, wherein the first plate comprises a first set of electrodes disposed on the first surface, each electrode of the first set of electrodes extending along a separate row of the first set of rows;
a second plate defining a second plurality of apertures arranged in a second set of rows and extending from a first surface of the second plate to a second surface of the second plate, wherein the second plate comprises a second set of electrodes disposed on the first surface of the second plate, each electrode of the second set of electrodes extending along a separate row of the second set of rows, and wherein each aperture of the second plurality of apertures is axially aligned with an aperture of the first plurality of apertures; and
a third plate positioned between the first plate and the second plate, wherein a first surface of the third plate is in contact with the second surface of the first plate and a second surface of the third plate is in contact with the first surface of the second plate, wherein the third plate defines a third plurality of apertures, each aperture of the third plurality of apertures axially aligned with an aperture of the first plurality of apertures and an aperture of the second plurality of apertures;
wherein
each electrode of the first set of electrodes further extends along sidewalls of each aperture of the first plurality of apertures intersected by an associated electrode;
each electrode of the second set of electrodes further extends along sidewalls of each aperture of the second plurality of apertures intersected by an associated electrode; and
the first set of electrodes are arranged at an angular offset from the second set of electrodes.

2. The plasma source of claim 1, wherein each axially aligned aperture of the first plurality of apertures, aperture of the second plurality of apertures, and aperture of the third plurality of apertures forms a plasma cell extending through the plasma source.

3. The plasma source of claim 1, further comprising:
a first power supply electrically coupled with each electrode of the first set of electrodes, the first power supply configured to deliver a first voltage along each electrode of the first set of electrodes.

4. The plasma source of claim 3, further comprising:
a second power supply electrically coupled with each electrode of the second set of electrodes, the second power supply configured to deliver a second voltage along each electrode of the second set of electrodes.

5. The plasma source of claim 4, wherein the first power supply and the second power supply are configured to produce an electrical discharge within a plasma cell positioned at an overlapping electrode of the first set of electrodes and an electrode of the second set of electrodes each receiving power.

6. The plasma source of claim 1, wherein each aperture of the first plurality of apertures is characterized by a first diameter, and wherein each aperture of the third plurality of apertures is characterized by a second diameter different from the first diameter.

7. The plasma source of claim 1, wherein each electrode of the first set of electrodes is maintained electrically isolated from each other electrode of the first set of electrodes along the first surface of the first plate.

8. The plasma source of claim 1, further comprising:
a layer of dielectric material overlying electrode material extending along sidewalls of each aperture of the first plurality of apertures.

9. The plasma source of claim 1, wherein each of the first plate, the second plate, and the third plate comprises a dielectric material.

10. The plasma source of claim 1, wherein the first set of electrodes extend into apertures of the first plurality of apertures and the second set of electrodes extend into apertures of the second plurality of apertures.

11. The plasma source of claim 1, wherein the first set of electrodes are formed in the first surface of the first plate and the second set of electrodes are formed in the first surface of the second plate.

12. The plasma source of claim 1, wherein the first set of electrodes are formed in at least one first trench defined by the first surface of the first plate and the second set of electrodes are formed in at least one second trench defined by the second surface of the second plate.

13. The plasma source of claim 1, wherein the second surface of the first plate is seated against a first outer-facing surface of the third plate and the first surface of the second plate is seated against a second outer-facing surface of the third plate.

14. The plasma source of claim 1, wherein a thickness of the third plate controls a distance between the first set of electrodes and the second set of electrodes.

15. The plasma source of claim 1, wherein dielectric material of each of the first plate and the second plate fully covers electrode material across surface of the respective plate.

16. The plasma source of claim 1, wherein a dielectric material is formed over portions of the first set of electrodes formed along sidewalls of apertures of the first plurality of apertures and the dielectric material is formed over portions of the second set of electrodes formed along sidewalls of apertures of the second plurality of apertures.

17. The plasma source of claim 1, wherein each aperture of the first and second plurality of apertures is characterized by a first diameter and each aperture of the third plurality of apertures is characterized by a second diameter different from the first diameter.

* * * * *